(12) United States Patent
Zhang

(10) Patent No.: US 9,559,104 B2
(45) Date of Patent: Jan. 31, 2017

(54) MASK READ-ONLY MEMORY ARRAY, MEMORY DEVICE, AND FABRICATION METHOD THEREOF

(71) Applicant: Semiconductor Manufacturing International (Shanghai) Corporation, Shanghai (CN)

(72) Inventor: Chao Zhang, Shanghai (CN)

(73) Assignee: SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 0 days.

(21) Appl. No.: 15/059,352

(22) Filed: Mar. 3, 2016

(65) Prior Publication Data

US 2016/0293614 A1    Oct. 6, 2016

(30) Foreign Application Priority Data

Mar. 31, 2015    (CN) .......................... 2015 1 0149093

(51) Int. Cl.
*H01L 29/76* (2006.01)
*H01L 29/94* (2006.01)
(Continued)

(52) U.S. Cl.
CPC ..... *H01L 27/11213* (2013.01); *H01L 21/0262* (2013.01); *H01L 21/26513* (2013.01); *H01L 21/26586* (2013.01); *H01L 21/324* (2013.01); *H01L 21/76224* (2013.01); *H01L 21/76877* (2013.01); *H01L 23/5226* (2013.01); *H01L 23/53257* (2013.01); *H01L 27/11293* (2013.01); *H01L 29/0649* (2013.01); *H01L 29/167* (2013.01); *H01L 29/36* (2013.01); *H01L 29/45* (2013.01); *H01L 29/66143* (2013.01); *H01L 29/872* (2013.01)

(58) Field of Classification Search
CPC .......... H01L 21/76889; H01L 21/0228; H01L 29/8615; H01L 21/3141; H01L 21/3212; H01L 21/76264; H01L 27/1104; H01L 27/0814; H01L 29/6603; H01L 29/435; H01L 51/0034; H01L 51/0508
USPC ................. 438/91, 179, 381, 680, 692, 510, 766,438/769; 257/104, 79, 288, 384, 454, 481, 549, 257/E21.006, E21.042, E21.043, E21.047, 257/E21.053, E21.056, E21.058, E21.361, 257/E21.368, E21.366, E21.435, E21.352, 257/E21.438
See application file for complete search history.

(56) References Cited

U.S. PATENT DOCUMENTS 5,583,368 A * 12/1996 Kenney ............... H01L 27/0922
257/621
6,653,692 B2 * 11/2003 Kao ......................... G11C 7/18
257/390

(Continued)

*Primary Examiner* — David Nhu
(74) *Attorney, Agent, or Firm* — Anova Law Group, PLLC

(57) ABSTRACT

A mask read-only memory array is provided. The mask read-only memory array includes a semiconductor substrate having a surface; and a heavily doped layer formed on the surface of semiconductor substrate. The mask read-only memory array also includes a plurality of lightly doped discrete regions formed on the heavily doped layer, and a metal silicide layer formed on the lightly doped discrete regions. Wherein the metal silicide layer and the plurality of reverse type lightly doped discrete regions form a plurality of Schottky diode memory cells. Further, the mask read-only memory array includes conductive vias formed one a partial number of the plurality of Schottky diode memory cells for applying column selecting voltage to select certain memory cells.

20 Claims, 10 Drawing Sheets

(51) Int. Cl.
*H01L 31/062* (2012.01)
*H01L 31/113* (2006.01)
*H01L 31/119* (2006.01)
*H01L 27/112* (2006.01)
*H01L 29/872* (2006.01)
*H01L 29/36* (2006.01)
*H01L 23/522* (2006.01)
*H01L 29/06* (2006.01)
*H01L 29/45* (2006.01)
*H01L 23/532* (2006.01)
*H01L 29/66* (2006.01)
*H01L 21/768* (2006.01)
*H01L 21/762* (2006.01)
*H01L 21/265* (2006.01)
*H01L 29/167* (2006.01)
*H01L 21/324* (2006.01)
*H01L 21/02* (2006.01)

(56) References Cited

U.S. PATENT DOCUMENTS

| | | | |
|---|---|---|---|
| 6,908,854 B2* | 6/2005 | Chang | H01L 21/0273 438/637 |
| 7,094,649 B2* | 8/2006 | Lee | G11C 11/5692 438/278 |
| 2004/0108573 A1* | 6/2004 | Herner | H01L 23/5252 257/530 |

* cited by examiner

MASK READ-ONLY MEMORY ARRAY, MEMORY DEVICE, AND FABRICATION METHOD THEREOF

CROSS-REFERENCES TO RELATED APPLICATIONS

This application claims the priority of Chinese patent application No. 201510149093.9, filed on Mar. 31, 2015, the entirety of which is incorporated herein by reference.

FIELD OF THE INVENTION

The present invention generally relates to the field of semiconductor technology and, more particularly, relates to a mask read-only memory array, memory device, and fabrication processes thereof.

BACKGROUND

It is well known that a non-volatile memory is still able to maintain the stored data even after its power is turned off. Recently, mask read-only memory (Mask ROMs) have been developed as a type of non-volatile memory. When Mask ROMs are formed, the data has been stored. A user can only use/read the data stored in the Mask ROMs; and is unable to program the data. Thus, the Mask ROMs have a relatively high dependability. Further, the Mask ROMs are formed by using masks. Thus, the fabrication process of the Mask ROMs is relatively simple, and the production cost is relatively low. Therefore, Mask ROMs have been widely used in a variety of electronic products.

Currently, MOS transistors are used as the memory cells of Mask ROMs. That is, the channel regions of the MOS transistors are doped by ion implantation or not doped by ion implantation to obtain different on-state voltages of the MOS transistors. The different on-state voltages are used to store the "0" or "1" of the data. However, the area of the MOS transistors are relatively large, and the memory density of the Mask ROMs is relatively small. With the continuous shrinking of the critical dimension of MOS transistors, the MOS transistors may have short-channel effect, hot carrier effect, and punch-through effect, etc.

To overcome such issues, diodes have been used to substitute the MOS transistors as the memory cells in the Mask ROMs. Although, diodes, i.e., PN junctions, occupy less area of the Mask ROMs, the on-state voltage of the diodes is relatively large. For example, the on-stage voltage of the diodes is in a range of approximately 0.7V~1V. Thus, the power consumption of data reading process is relatively large. Further, the PN junctions are turned on by the minority carriers. Thus, the Mask ROMs using the PN junction diodes as the memory cells have a relatively low running speed during the data reading process.

The disclosed device structures and methods are directed to solve one or more problems set forth above and other problems.

BRIEF SUMMARY OF THE DISCLOSURE

One aspect of the present disclosure includes providing a mask read-only memory array. The mask read-only memory array includes a semiconductor substrate having a surface; and a heavily doped layer formed on the surface of semiconductor substrate. The mask read-only memory array also includes a plurality of lightly doped discrete regions formed on the heavily doped layer, and a metal silicide layer formed on the lightly doped discrete regions. Wherein the metal silicide layer and the plurality of lightly doped discrete regions form a plurality of Schottky diode memory cells. Further, the mask read-only memory array includes conductive vias formed on a partial number of the plurality of Schottky diode memory cells for applying column selecting voltage to select certain memory cells.

Another aspect of the present disclosure includes providing a method for forming a mask read-only memory array. The method includes providing a semiconductor substrate; and forming a heavily doped layer on the semiconductor substrate. The method also includes forming a plurality of lightly doped discrete regions on the heavily doped layer; and forming a metal silicide layer on the plurality of lightly doped discrete regions to form a plurality of Schottky diode memory cells with the plurality of lightly doped discrete regions; and forming conductive vias on a partial number of the plurality of Schottky diode memory cells for applying column selecting voltage to select certain memory cells.

Another aspect of the present disclosure includes providing a method for forming a mask read-only memory device. The method includes providing a semiconductor substrate having a core device region and a peripheral region; and forming a heavily doped layer on the semiconductor substrate. The method also includes forming a plurality of lightly doped discrete regions in the semiconductor substrate in the core device region and a plurality of well regions on the semiconductor substrate in the peripheral region. Further, the method also includes forming a gate structure on each of the well regions in the peripheral region and source and drain regions in the semiconductor substrate at both sides of the gate structure. Further, the method also includes forming a metal silicide layer on the plurality of lightly doped discrete regions, the source and drain regions and the gate structure. Wherein the metal silicide layer and the plurality of lightly doped discrete regions form a plurality of Schottky diode memory cells. Further, the method also includes forming conductive vias on a partial number of the plurality of memory cells, the gate structures and the source and drain regions. Wherein the conductive vias on the partial number of the plurality of memory cells are used to apply column selecting voltage on the memory cells to select certain memory cells.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

Figure 1:
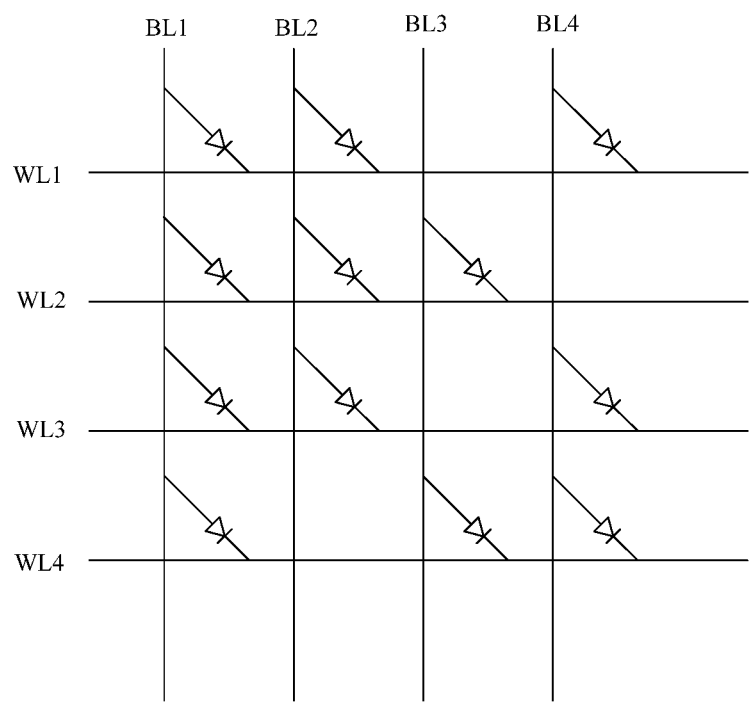
FIG. 1 illustrates an exemplary circuitry diagram of a mask read-only memory array consistent with the disclosed embodiments.
Figure 2:
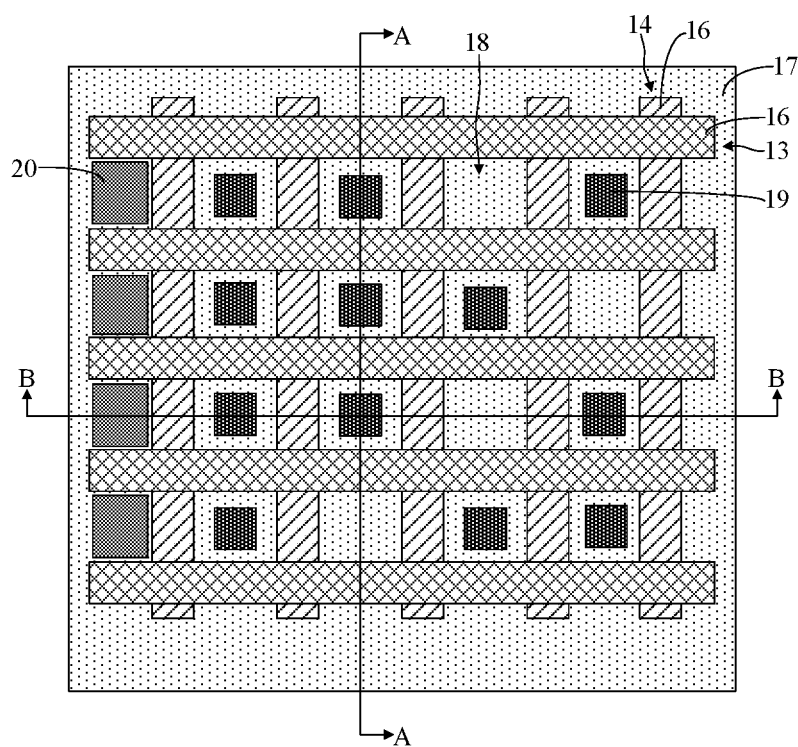
FIG. 2 illustrates a top view of the mask read-only memory array illustrated in FIG. 1.
Figure 3:
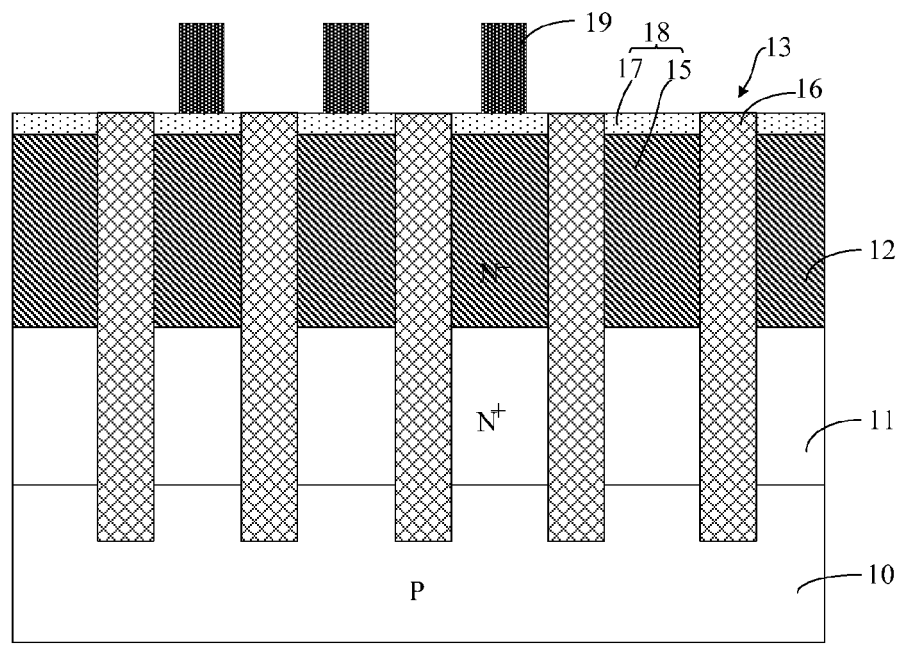
FIG. 3 illustrates a cross-sectional view of the structure illustrated in FIG. 2 along the A-A direction.
Figure 4:
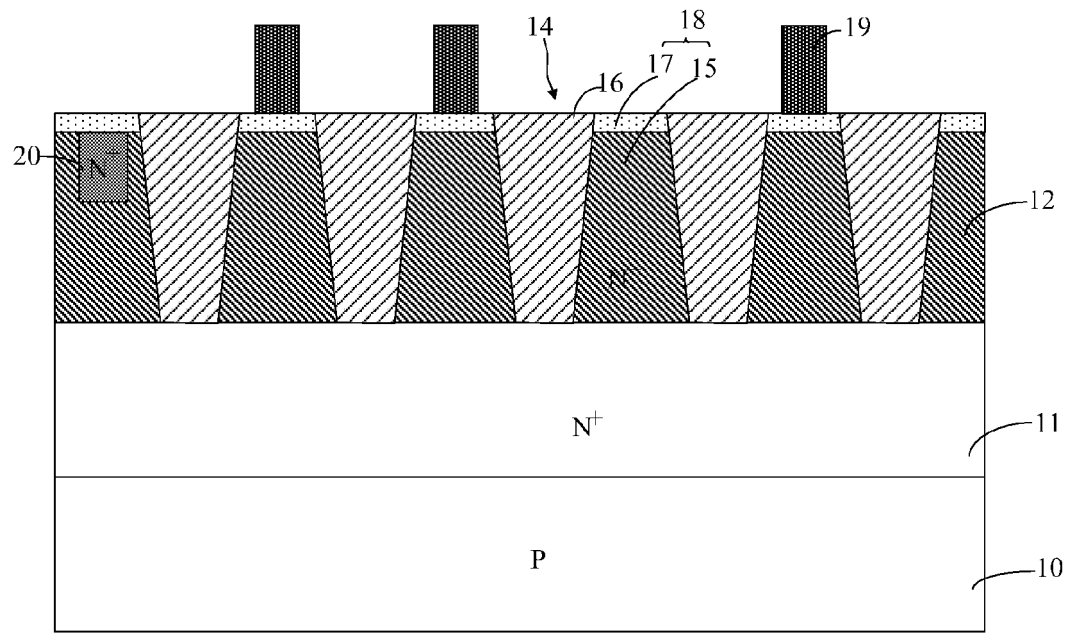
FIG. 4 illustrates a cross-sectional view of the structure illustrated in FIG. 2 along the B-B direction.

FIG. 1 illustrates a circuitry diagram of a mask read-only memory (Mask ROM) array consistent with the disclosed embodiments. FIG. 2 illustrates a top view of the Mask ROM array illustrated in FIG. 1; FIG. 3 illustrates a cross-sectional view of the structure illustrated in FIG. 2 along the A-A direction; and FIG. 4 illustrates a cross-sectional view of the structure illustrated in FIG. 2 along the B-B direction.

As shown in FIGS. 1~2, for illustrative purposes, a Mask ROM array with sixteen memory cells electrically connecting with four word-lines (WLs) and four bit-lines (BLs) will be described. In certain other embodiments, the mask ROM array may have other appropriate number of memory cells electrically connecting with the corresponding BLs and WLs. The memory cells may be Schottky diodes. A Schottky diode is formed by a semiconductor substrate may include a semiconductor material and a metal layer formed on the semiconductor material. The semiconductor material and the metal layer form a Schottky barrier.

As shown in FIGS. 1~4, the Mask ROM array may include a semiconductor substrate 10; and a heavily doped layer 11 formed on a surface of the semiconductor substrate 10. The Mask ROM array may also include a lightly doped layer 12 formed on the heavily doped layer 11. The conductive type of the heavily doped layer 11 and the conductive type of the lightly doped layer 12 may be different from the conductive type of the semiconductor substrate 10. For example, the semiconductor substrate 10 may be a P-type and the heavily doped layer 11 and the lightly doped layer 12 may be a N-type. Other types may also be used.

Further, a plurality of deep trenches 13 may be formed in the heavily doped layer 11 and the lightly doped layer 12. The plurality of deep trenches 13 may also penetrate into the semiconductor substrate 10 with a pre-determined depth. Referring to FIG. 2, in one embodiment, the plurality of deep trenches 13 may be distributed along a first direction. In one embodiment, the first direction is a row direction. The portions of the heavily doped layer 11 and the portions of the lightly doped layer 12 at two sides of the deep trenches 13 may be electrically insulated.

Further, a plurality of shallow trenches 14 may be formed in the lightly doped layer 12. The bottoms of the shallow trenches 14 may be at the interface between the heavily doped layer 11 and the lightly doped layer 12. Referring to FIG. 2, in one embodiment, the plurality of shallow trenches 14 may be distributed along a second direction. In one embodiment, the second direction is a column direction. The deep trenches 13 may cross the shallow trenches 14; and may be perpendicular to the shallow trenches 14. That is, the first direction may be perpendicular to the second direction.

Further, an insulation material 16 may be filled in the deep trenches 13 and the shallow trenches 14. The adjacent deep trenches 13 and the adjacent shallow trenches 14 may define a plurality of lightly doped discrete regions 15. That is, the lightly doped layer 12 may be electrically insulated into a plurality of lightly doping discrete regions 15 by the plurality of the deep trenches 13 and the plurality of shallow trenches 14 filled with the insulation material 16.

Further, a metal silicide layer 17 is formed on each of the plurality of lightly doped discrete regions 15. A lightly doped discrete region 15 and the metal silicide layer 17 formed on the lightly doped discrete region 15 may form a Schottky diode memory cell 18.

For the plurality of Schottky diode memory cells 18, a partial number of them may be connected with conductive vias 19; and the rest of them may not be connected with conductive vias 19. A selecting voltage may be applied to the conductive vias 19 to select certain memory units 18 to achieve "1" writing status. That is, data "1" may be storage. The plurality of Schottky diode memory cells 18 without conductive vias 19 being formed on their surfaces may achieve "0" writing stratus. That is, data "0" may be stored.

Further, as shown in FIG. 2 and FIG. 4, electrode regions 20 may be formed the rows of portions of the lightly doped layer 12 insulated by the deep trenches 13. A row selecting voltage may be applied on the corresponding row by the electrode region 20 through the corresponding portion of the heavily doped layer 11.

In one embodiment, the semiconductor substrate 10 may be doped with P-type ions; the heavily doped layer 11 may be N-type heavily doped ($N^+$); and the lightly doped layer 12 may be N-type lightly doped ($N^-$). The metal silicide layer 17 may be made of any appropriate material, such as nickel silicide, cobalt silicide, or titanium silicide, etc., as long as the metal silicide layer 17 and the lightly doped layer 12 are able to form a Schottky barrier. Further, the doping concentration of the N-type heavily dope layer ($N^+$) 11 may be any appropriate value, as long as the selecting voltage would be applied on the entire row of portions of N-type lightly doped layer ($N^-$) 12 insulated by the deep trenches 13 through the N-type heavily doped layer ($N^+$) 11.

In certain other embodiments, by selecting the material of the metal silicide layer 17, the semiconductor substrate 10 may be doped with N-type ions. Correspondingly, the heavily doped layer 11 may be a P-type heavily doped layer ($P^+$); and the lightly doped layer 12 may be a P-type lightly doped layer ($P^-$).

Referring to FIGS. 1~2, the data reading process of the Mask ROM may include following steps.

For the rows, the electrode regions 20 may be connected with the word-lines (WLs). The word-line signal may sequentially apply a row selecting voltage to the corresponding row of portions of the lightly doped layer 12 through the corresponding electrode region 20 and the corresponding row of the heavily doped layer 11.

For the columns, some of the Schottky diode memory cells 18 may be connected with the conductive vias 19; and the rest of the Schottky diode memory cells 18 may not be connected with the conductive vias 19. When bit-line (BL) signals are applied on the memory cells 18 being connected with conductive vias 19, the memory cells 18 may be turned on through the conductive vias 19. Thus, close loops may be formed; and high-level reading signals may be obtained. The high-level reading signal is recorded as "1". For the memory cells 18 without being connected with conductive vias 19, the memory cells 18 may not be turned on; and the reading signals may be low-level signals. The low-level reading signal is recorded as "0".

By depositing or not depositing conductive vias 19 on the Schottky diode memory cells 18, the "0" status and the "1" status may be written into the Mask ROM array. For the data reading process, the on-stage voltage of the Schottky diode may be relatively small. For example, the on-stage voltage of the Schottky diode may be approximately 0.24V smaller than the on-state voltage of a MOS transistor. Thus, the power consumption of the data reading process may be relatively small. Further, the Schottky diodes may be turned on by majority carriers. Thus, the data reading process may be relatively fast.

According to the data reading process, the purpose to dispose the shallow trenches 14 is to divide the lightly doped layer 12 to form a plurality of lightly doped discrete regions 15. Thus, the shallow trenches 14 may be at least reach the interface between the heavily doped layer 11 and the lightly doped layer 12. In certain other embodiments, the shallow trenches 14 may also partially penetrate through the heavily doped layer 11.

Figure 5:
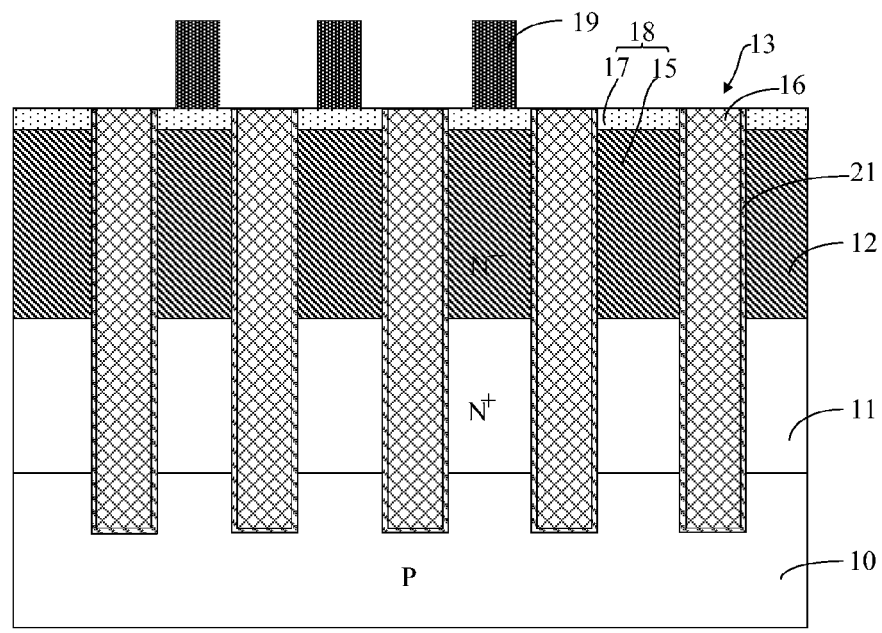
FIG. 5 illustrates another exemplary mask read-only memory array consistent with the disclosed embodiments with a viewing direction corresponding to FIG. 3.
Figure 6:
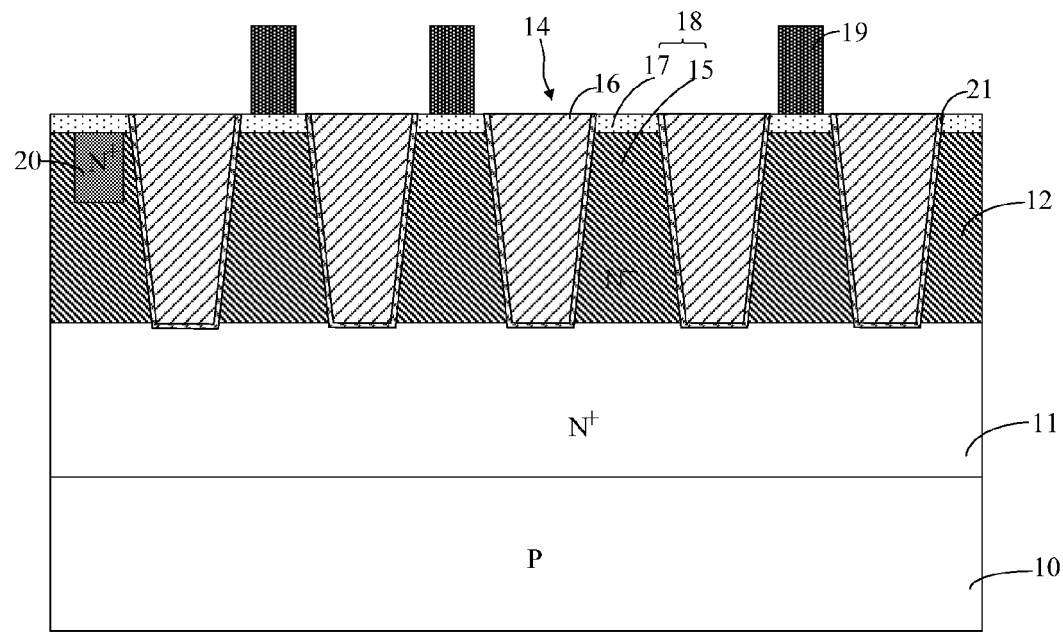
FIG. 6 illustrates the exemplary mask read-only memory array illustrated in FIG. 5 with a viewing direction corresponding to FIG. 4.

FIGS. 5~6 illustrate another exemplary Mask ROM array consistent with the disclosed embodiments. As shown in FIGS. 5~6, comparing with the Mask ROM array illustrated in FIGS. 3~4, a heavily doped region 21 may be formed in the side and bottom surfaces of the deep trenches 13 and shallow trenches 14.

As shown in FIG. 5, the heavily doped region 21 may extend in the side and bottom surfaces of the deep trenches 13 with a pre-determined depth. That is, the heavily doped region 21 may be in the lightly doped layer 12, the heavily doped layer 11 and the semiconductor substrate 10; and extend from side and bottom surfaces of the deep trenches 13 to the lightly doped layer 12, the heavily doped layer 11 and the semiconductor substrate 10 with a pre-determined depth. The heavily doped region 21 on the side and bottom surfaces of the deep trenches 13 may be used to improve the insulation performance of the deep trenches 13 so as to cause the adjacent heavily doped layer 11 and the lightly doped layer 12 not to have crosstalk. The doping type of the heavily doped region 21 may be different from the doping type of the lightly doped layer 12. For example, if the lightly doped layer 12 is an N-type lightly doped layer (N$^-$), the heavily doped region 21 may be P-type heavily doped (P$^+$).

Further, as shown in FIG. 5, the heavily doped region 21 may include three portions. For the portions of the heavily doped region 21 formed in the lightly doped layer 12, the heavily doped region 21 may be formed in pre-determined depth from the side surfaces of the trenches 13 to the lightly doped layer 12; and a depletion layer (not labeled) may be formed in the interface layer between the portions of the heavily doped region 21 and the lightly doped layer 12. For the portions of the heavily doped region 21 formed in the heavily doped layer 11, the heavily doped region 21 may be formed in the pre-determined depth from the side surfaces of the trenches 13 to the heavily doped layer 11, a depletion layer (not labeled) may be formed in the interface layer between the portions of the heavily doped region 21 and the heavily doped layer 11. For the portions of the heavily doped region 21 formed in the semiconductor substrate 10, the portions of the heavily doped region 21 may be formed in the pre-determined depth from the side and the bottom surfaces of the deep trenches 13 to the semiconductor substrate 10.

Further, as shown in FIG. 6, the heavily doped region 21 may extend in the side and the bottom surfaces of the shallow trenches 14 with a pre-determined depth. That is, the heavily doped region 21 may be in the lightly doped layer 12 and the heavily doped layer 13. The heavily doped region 21 in the side surfaces of the shallow trenches 14 may be used to reduce the reverse leakage current of the Schottky diode memory cells 18 formed in the lightly doped region 21. Similarly, the doping type of the heavily doped region 21 in the side surfaces of the shallow trenches 14 may also be different from the lightly doped layer 12. A depletion layer may be formed in the interface layer between the heavily doped region 21 and the lightly doped layer 12. In one embodiment, the heavily doped region 21 may also be formed in the heavily doped layer 11 at the bottoms of the shallow trenches 14.

In one embodiment, the row selecting voltage may be applied using the word-lines (WLs); and the column selecting voltage may be applied using the bit-lines (BLs). In certain other embodiments, the row selecting voltage may be applied using the BLs; and the column selecting voltage may be applied using the WLs.

Figure 19:
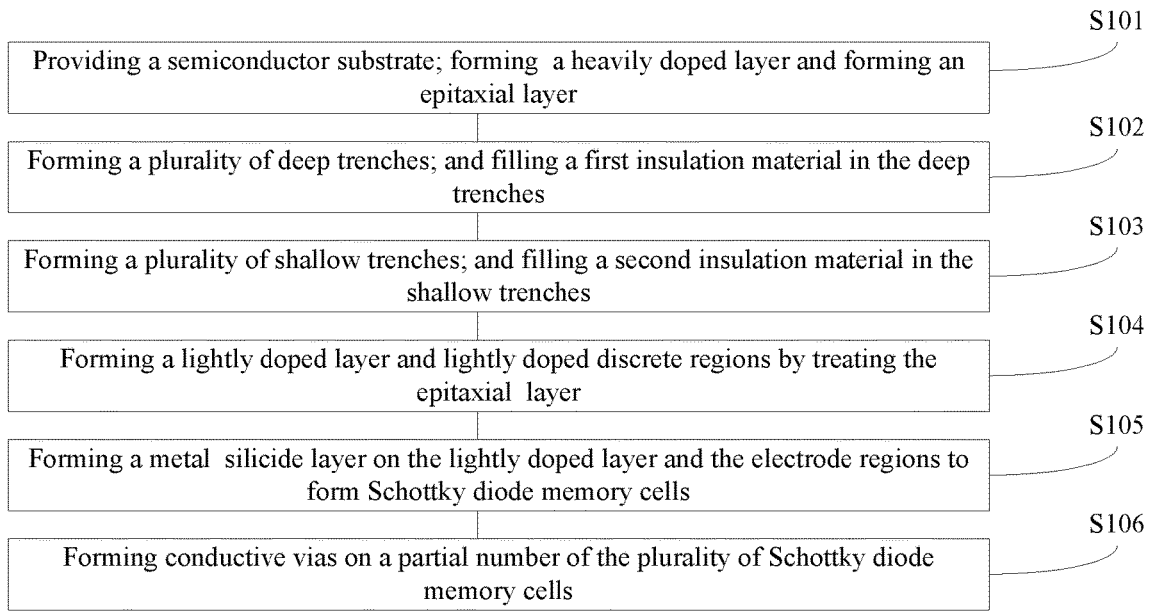
FIG. 19 illustrates an exemplary fabrication process of a mask read-only memory array consistent with the disclosed embodiments.

FIG. 19 illustrates an exemplary fabrication process of a Mask ROM array consistent with the disclosed embodiments. FIGS. 7~14 illustrate semiconductor structures corresponding to certain stages of the exemplary fabrication process.

Figure 7:
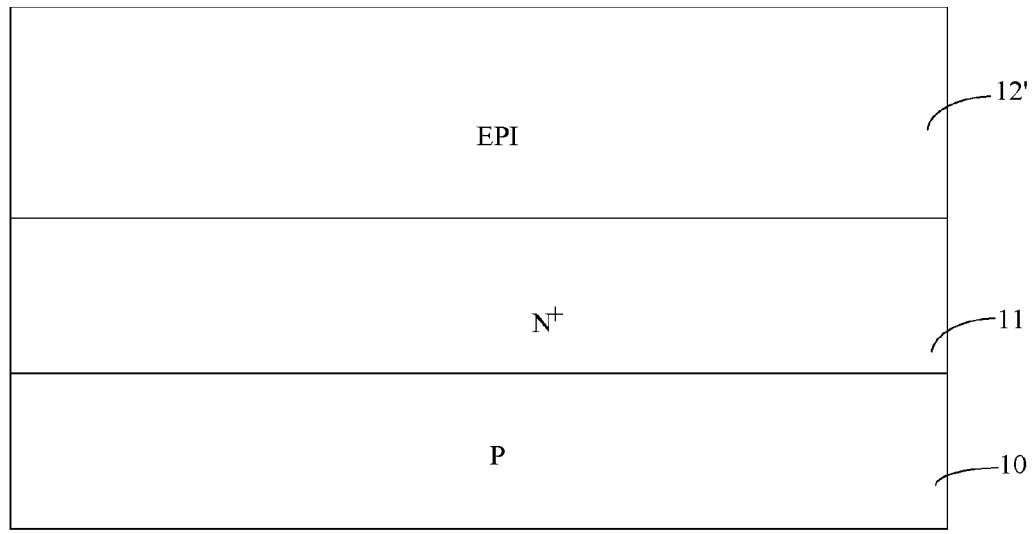
FIGS. 7~14 illustrate structures corresponding to certain stages of an exemplary fabrication process of a mask read-only memory array consistent with the disclosed embodiments.

As shown in FIG. 19, at the beginning of the fabrication process, a semiconductor substrate with certain structures is provided (S101). FIG. 7 illustrates a corresponding semiconductor structure.

As shown in FIG. 7, a semiconductor substrate 10 is provided. A heavily doped layer 11 may be formed on a surface of the semiconductor substrate 10. Further, an epitaxial layer (EPI) layer 12' may be formed on the heavily doped layer 11.

The semiconductor substrate 10 may be made of any appropriate semiconductor materials, such as single crystal silicon, polysilicon, silicon on insulator (SOI), germanium on insulator (GOI), silicon germanium, carborundum, indium antimonite, lead telluride, indium arsenide, indium phosphide, gallium arsenide, gallium antimonite, alloy semiconductor or a combination thereof. In one embodiment, the semiconductor substrate 10 is made of silicon. The semiconductor substrate 10 provides a base for subsequent devices and processes.

The semiconductor substrate 10 may be doped with any appropriate type ions. In one embodiment, the semiconductor substrate 10 is doped with P-type ions by an ion implantation process. Specifically, a lightly doping process with B ions, or BF$_2$ ions, etc., may be performed on certain regions of the silicon substrate 10.

In one embodiment, the doping ions are B ions. The doping dosage may be in a range of approximately 2.0e13 cm$^{-2}$~2.2e14 cm$^{-2}$. The energy of the ion implantation process may be in a range of approximately 50 KeV~150 KeV.

The heavily doped layer 11 may be doped with any appropriate type of ions. In one embodiment, the heavily doped layer 11 is N-type heavily doped. Thus, the heavily dope layer 11 may also be referred as a buried N$^+$ layer. The heavily doped layer 11 may be formed by performing an ion implantation process on the surface of the P-type doped semiconductor layer 10 with a pre-determined depth. The doping ions may be As ions, P ions, or Sb ions, etc.

In one embodiment, the doping ions are As ions. The doping dosage may be in a range of approximately 1.0e15

$cm^{-2}$~$8.0e15$ $cm^{-2}$. The energy of the ion implantation process may be in a range of approximately 30 KeV~80 KeV.

After the ion implantation process, a high temperature thermal annealing process may be performed to activate the doping ions. In certain other embodiments, the high temperature thermal annealing process for activating the doping ions may be performed after the subsequent ion implantation processes performed on other layers.

The EPI layer 12' may be made of any appropriate material, such as silicon, silicon germanium, or compound semiconductor, etc. In one embodiment, the EPI layer 12' is made of silicon.

Various processes may be used to form the EPI layer 12', such as a chemical vapor deposition (CVD) process, an epitaxial growth process, or an atomic layer deposition (ALD) process, etc. In one embodiment, the EPI layer 12' is formed by a CVD process.

In one embodiment, the source gas of the CVD process may include $SiH_2Cl_2$, etc. The deposition temperature may be in a range of approximately 950° C.–1100° C. The thickness of the EPI layer 12' may be in a range of approximately 1000 Å~6000 Å. In certain other embodiments, the source gas of the CVD process may include $SiH_4$. The deposition temperature may be in a range of approximately 500° C.~900° C. The thickness of the EPI layer 12' may be in a range of approximately 1000 Å~6000 Å.

Figure 8:
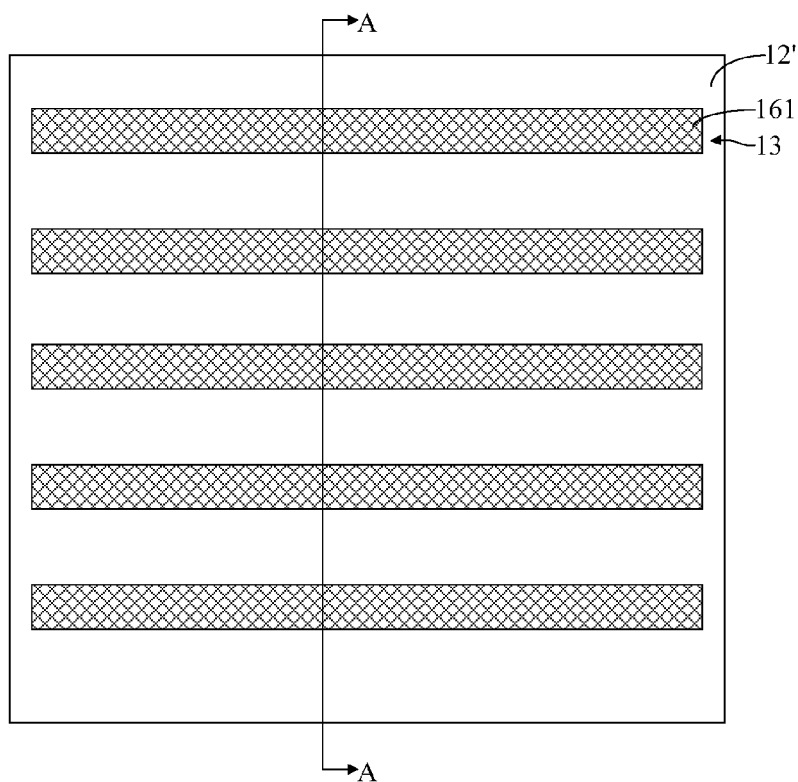
Figure 9:
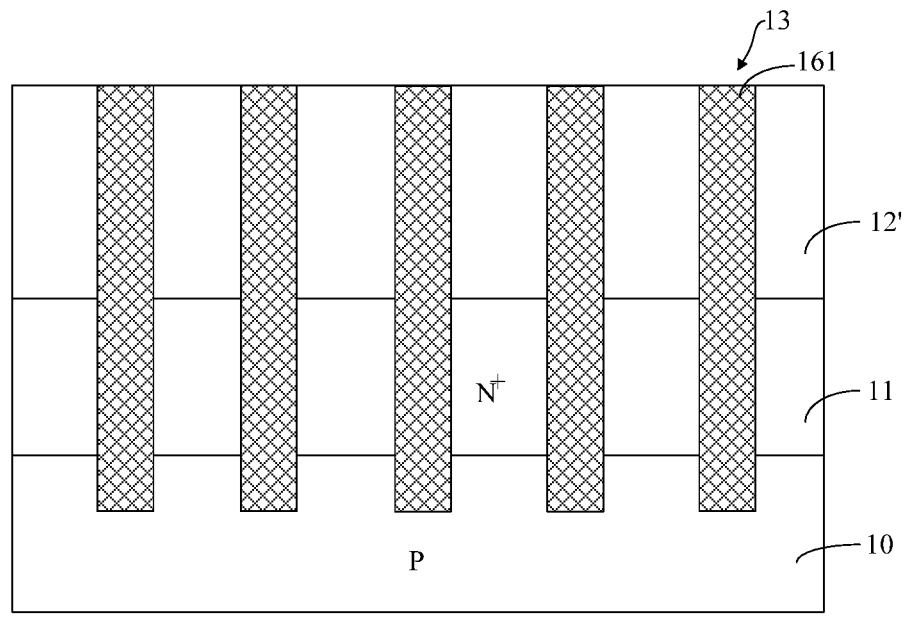

Returning to FIG. 19, after forming the EPI layer 12', a plurality of deep trenches may be formed; and the first deep trenches may be filled with a first insulation material (S102). FIGS. 8~9 illustrate a corresponding semiconductor structure; and FIG. 9 illustrates the semiconductor illustrated in FIG. 8 along the "AA" direction.

As shown in FIGS. 8~9, a plurality of deep trenches 13 are formed; and the plurality of deep trenches 13 may be filled with a first insulation material 161. The plurality of the deep trenches 13 may penetrate through the EPI layer 12', the heavily doped layer 11; and may penetrate into the semiconductor substrate 10 with a pre-determined depth.

The plurality of the deep trenches 13 may be formed by etching the EPI layer 12', the heavily doped layer 11; and the pre-determined depth of the semiconductor substrate 10 using a first patterned mask. The first patterned mask may be a first patterned photoresist layer, or a first patterned hard mask layer, etc.

The first patterned photoresist layer may be formed by spin-coating a photoresist layer on the EPI layer 12'; exposing the photoresist layer; and developing the exposed photoresist layer. The first patterned hard mask layer may be formed by, sequentially, forming a hard mask material layer on the EPI layer 12'; forming a photoresist layer on the hard mask material layer; exposing the photoresist layer; developing the exposed photoresist layer to form a patterned photoresist layer; and etching the hard mask material layer using the patterned photoresist layer as an etching mask by a dry etching process. Thus, the patterns on the patterned photoresist layer may be transferred to the hard mask material layer; and the first patterned hard mask may be formed.

The EPI layer 12', the heavily doped layer 11; and the pre-determined depth of the semiconductor substrate 10 may be etched by any appropriate process. In one embodiment, the EPI layer 12', the heavily doped layer 11; and the pre-determined depth of the semiconductor substrate 10 are etched by a dry etching process.

The depth of the plurality of deep trenches 13 may be any appropriate value. In one embodiment, the depth of the plurality of deep trenches 13 is greater than approximately 0.6 μm.

In one embodiment, after forming the plurality of deep trenches 13, the first patterned photoresist layer and its residues, or the first patterned hard mask layer and it residues may be removed. Then, a first insulation material layer may be formed on the surface of the EPI layer 12' and in the plurality of the deep trenches 13; and followed by removing the portion of the first dielectric material layer higher than the surface of the surface of the EPI layer 12' by a planarization process. Thus, the plurality of deep trenches 13 may be filled with the first insulation material 161.

The first insulation material 161 may be any appropriate material. In one embodiment, to increase the insulation effect, the first insulation material 161 is un-doped polysilicon. In certain other embodiments, the first insulation material 161 may be silicon dioxide, etc.

The first insulation material layer may be formed by any appropriate process, such as a CVD process, a PVD process, or an FCVD process, etc. The planarization process may be any appropriate process. In one embodiment, the planarization process is a chemical mechanical polishing process.

Figure 10:
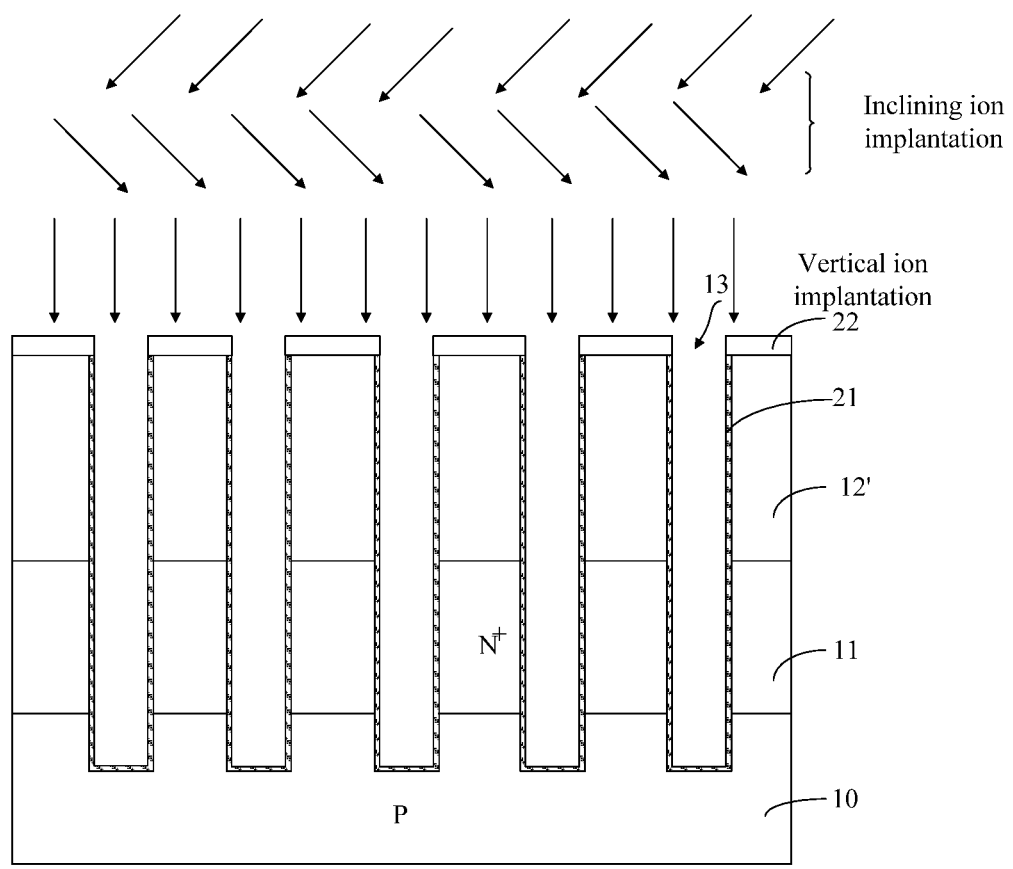

In certain other embodiments, as shown in FIG. 10, after forming the plurality of deep trenches 13, the first patterned photoresist layer or the first patterned hard mask layer 22 may be kept. Then, a liner oxide layer (not shown) may be formed on the inner surfaces of the plurality of deep trenches 13. Then, a vertical ion implantation process and an inclining ion implantation process may be performed to the plurality of deep trenches 13 using the first patterned photoresist layer or the first patterned hard mask layer 22 as an etching mask. Thus, a heavily doped region 21 may be formed on the inner surfaces of the plurality of deep trenches 13.

The liner oxide layer may be used to protect the plurality of the deep trenches 13. The vertical ion implantation process may refer that the direction of the ions is perpendicular to the semiconductor substrate 10. The inclining ion implantation process may refer that the direction of the ions has a certain angle with the side surfaces of the plurality of deep trenches 14.

The doping type of the ion implantation processes may be different from the doping type of the heavily doped layer 11. In one embodiment, the heavily doped layer 11 is N-type doped. Thus, the ions of the ion implantation processes may be P-type.

In one embodiment, the ions of the ion implantation processes are B ions. The dosage of the ion implantation processes may be in a range of approximately $1.0e13$ $cm^{-2}$~$8.0e14$ $cm^{-2}$. The energy of the ion implantation process may be in a range of approximately 5 KeV~30 KeV. The inclining angle, i.e., an angle with the vertical direction, of the implanting ions may be in a range of approximately 0~45°.

In certain other embodiments, the ions of the ion implantation processes are $BF_2$ ions. The dosage of the ion implantation processes may be in a range of approximately $1.0e12$ $cm^{-2}$~$5.0e14$ $cm^{-2}$. The energy of the ion implantation process may be in a range of approximately 5 KeV~30 KeV. The inclining angle, i.e., an angle with the vertical direction, of the implanting ions may be in a range of approximately 0~45°.

In one embodiment, when the ion plantation processes are performed, the thickness of the pad oxide layer may be in a range of approximately 200 Å~600 Å. The thickness of the mask 22 of the ion implantation process may be in a range of approximately 600 Å~1200 Å. The mask 22 of the ion implantation processes may be the leftover portion of the patterned mask formed on the EPI layer 12' for forming the plurality of deep trenches 13.

Thus, after the ion implantation processes, including the vertical ion implantation process and the inclining ion implantation process, the side surfaces and the bottom surfaces of the deep trenches 13 are implanted with a certain depth, and the heavily doped region 21 may be formed. The heavily doped region 21 may be on the side surfaces of the EPI layer 12' and the heavily doped layer 11, and the surfaces of the semiconductor substrate 10 exposed by the plurality of deep trenches 13.

In certain other embodiments, the ion implantation process may only include the inclining ion implantation process. By choosing proper ion implantation angles, the heavily doped region 21 may only be formed on the side surfaces of the EPI layer 12' exposed by the plurality of deep trenches 13 in a pre-determined depth.

After forming the heavily doped region 21, the first insulation material 161 may be filled in the plurality of the deep trenches 13. The first insulation material 161 may be formed on the pad oxide layer.

Figure 11:
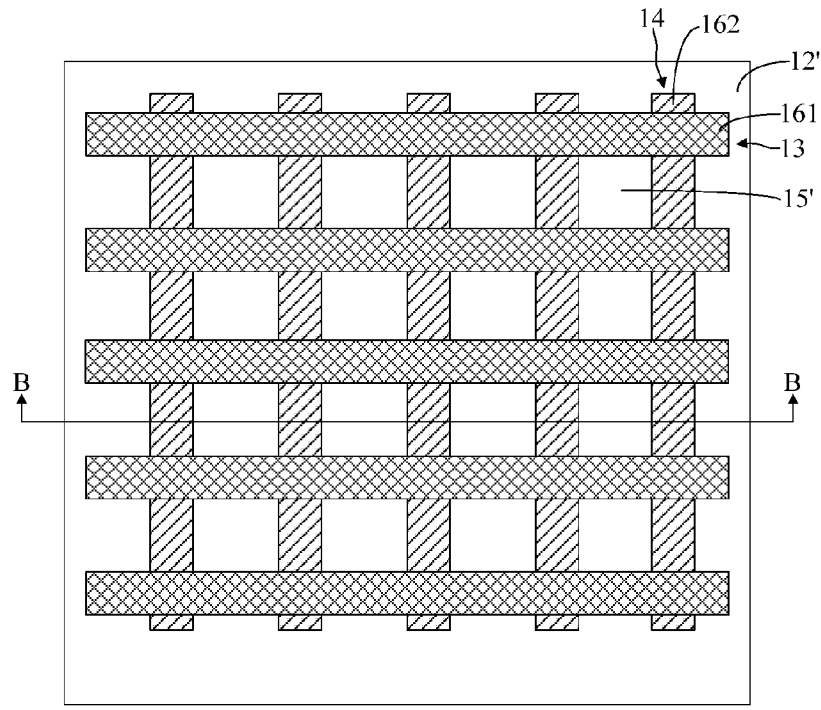
Figure 12:
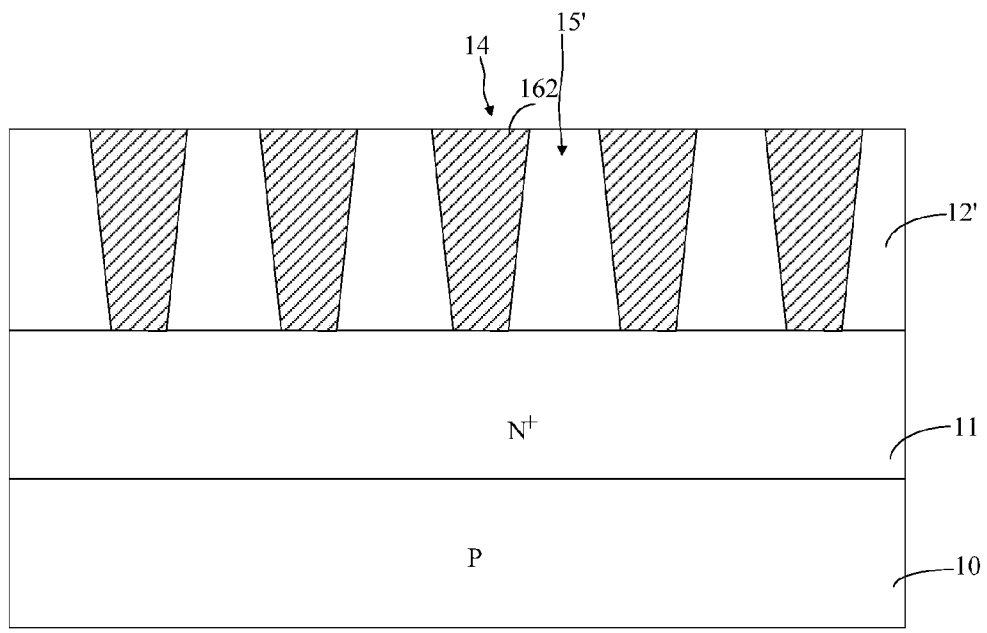

Returning to FIG. 19, after forming the plurality of deep trenches 13 and the first insulation material 161, a plurality of shallow trenches may be formed; and a second insulation material may be formed in the plurality of shallow trenches (S103). FIGS. 11~12 illustrate a corresponding semiconductor structure. FIG. 12 illustrates a cross-sectional view of the structure illustrated in FIG. 11 along the B-B direction.

As shown in FIGS. 11~12, a plurality of shallow trenches 14 are formed in the EPI layer 12'. The plurality of shallow trenches 14 may be distributed along a column direction. That is, the plurality of shallow trenches 14 may perpendicularly cross the plurality of deep trenches 13. A second insulation material 162 may be formed the plurality of shallow trenches 14. The adjacent deep trenches 13 and the adjacent shallow trenches 14 may limit a plurality of epitaxial discrete regions 15'. That is, the EPI layer 12' may be divided into a plurality of epitaxial discrete regions 15' by the first insulation material 161 and the second insulation material 162. In one embodiment, the depth of the shallow trenches 14 may be in a range of approximately 2000 Å~5000 Å. The shallow trenches 14 and the second insulation material 162 may be referred as shallow trench isolation structures.

A process for forming the plurality of shallow trenches 14 may include performing a photolithography process to form a patterned mask layer; and followed by etching the EPI layer 12' using patterned mask layer as an etching mask. In one embodiment, besides the patterns for forming the plurality of shallow trenches 14, the patterned mask layer may also include the patterns corresponding to the deep trenches 13. When such a patterned mask is used to form the plurality of shallow trenches 14, the first insulation 161 may also be removed with a certain depth. Further, when the plurality of shallow trenches 14 are subsequently filled with the second insulation material 162, the removed portion of the first insulation material 161 may also be filled.

The EPI layer 12' may be etched by any appropriate process, such as a dry etching process, or a wet etching process, etc. In one embodiment, a dry etching process is used to etch the EPI layer 12' to form the plurality of shallow trenches 14; and to also remove the portions of the first insulation material 161. In one embodiment, referring to FIG. 12, by controlling the parameters of the dry etching process, the shallow trench 14 may have a larger opening and a smaller bottom. In one embodiment, the inclining angle of the side surface of the shallow trenches 14, i.e., an angle with the lateral direction, may be in a range of approximately 75°~88°.

A process for forming the second insulation material 162 may include forming a second insulation material layer on the EPI layer 12' and in the plurality of shallow trenches 14 and the removed portion of the first insulation material 161; and followed by planarizing the second insulation material layer until the top surface of the EPI layer 12' is exposed. Thus, the portion of the second insulation material layer higher than the top surface of the EPI layer 12' may be removed; and the second insulation material 162 may be filled in the plurality of shallow trenches 14 and the removed portion of the first insulation material 161.

The second insulation material 162 may be any appropriate material, such as silicon oxide, or silicon oxynitride, etc. Various processes may be used to form the second insulation material layer, such as a CVD process, or an FCVD process, etc. The second insulation material layer may be planarized by any appropriate process, such as a chemical mechanical polishing process, etc.

Thus, in one embodiment, referring to FIGS. 2~4, FIG. 9 and FIG. 12, the insulation material in the deep trenches 13 may have two portions. One portion is the bottom portion in the deep trenches 13, which may be made of the first insulation material 161, such as un-doped polysilicon, or silicon oxide. The second portion is the top portion in the deep trenches 13, which may be made of the second insulation material 162, such as silicon oxide, etc. In certain other embodiments, the insulation material in the deep trenches 13 may be only the first insulation material 161. In certain other embodiments, the first insulation material 161 may be identical to the second insulation material 162.

Figure 13:
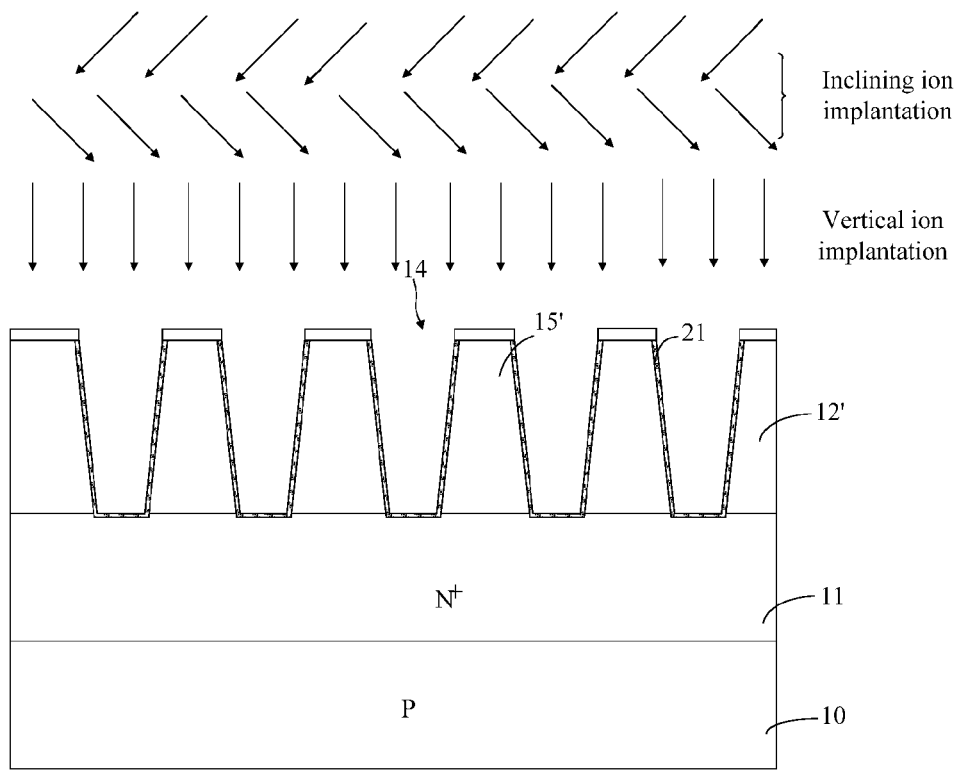

In certain other embodiments, as shown in FIG. 13, before forming the second insulation material 162, a pad oxide layer (not shown) may be formed on the side surfaces of the plurality of shallow trenches 14; and a first heavily doped region may also be formed in the inner side surfaces of the plurality of shallow trenches 14. In one embodiment, the first heavily doped region may be identical to the heavily doped region 21. Thus, the first heavily doped layer may also be referred as a heavily doped region 21. The thickness of the pad oxide layer may be in a range of approximately 200 Å~600 Å.

The heavily doped region 21 may be formed by ion implantation processes. Referring to FIG. 13, the ion implantation processes may include a vertical ion implantation process and an inclining ion implantation process. The dosage of the ion implantation processes may be in a range of approximately $1.0e13\ cm^{-2} \sim 8.0e14\ cm^{-2}$. The energy of the ion implantation process may be in a range of approximately 5 KeV~30 KeV. In one embodiment, when the shallow trenches 14 have the shape illustrated in FIG. 13, i.e., a larger opening and a smaller bottom, the angle of the inclining ion implantation process may be in a range of approximately 7°~45°.

Further, referring to FIG. 13, the left over patterned mask layer (not labeled) used for forming the plurality of shallow trenches 14 may be used as the mask for the ion implantation processes. In one embodiment, the thickness of the leftover patterned mask may be in a range of approximately 600 Å~1000 Å.

After the ion implantation processes, the second insulation material 162 may be filled the plurality of shallow trenches 14. In one embodiment, the second insulation material 162 may be formed on the pad oxide layer.

Figure 14:
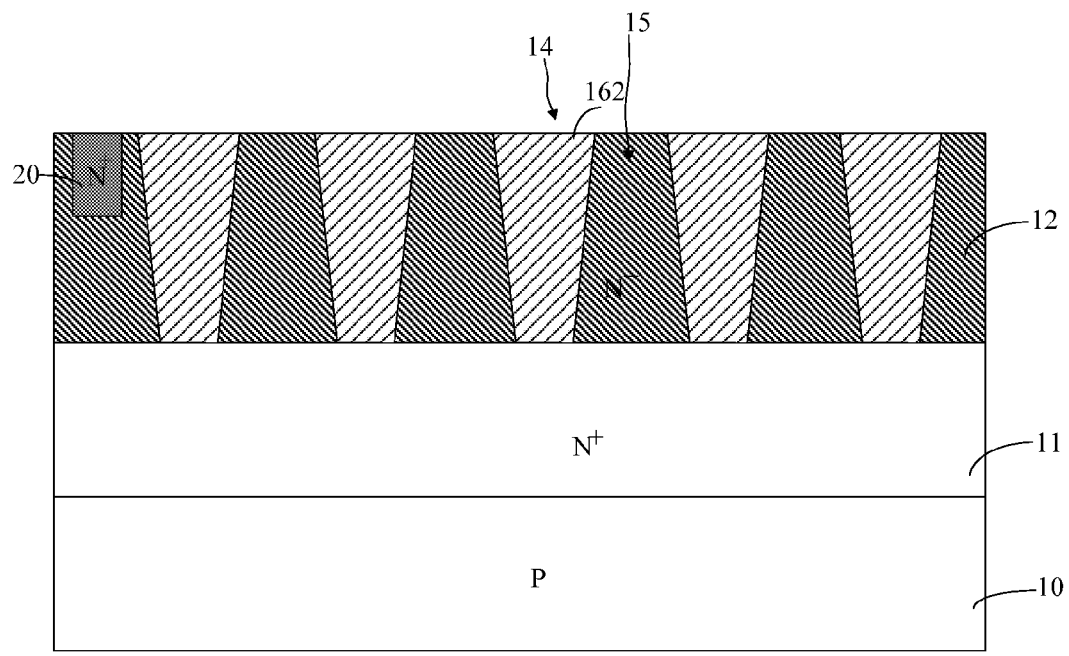

Returning to FIG. 19, after forming the second insulation material 162, a lightly doped layer may be formed (S104). FIG. 14 illustrates a corresponding semiconductor structure.

As shown in FIG. 14, a lightly doped layer 12 is formed. The lightly doped layer 12 may be formed by treating the EPI layer 12'. Correspondingly, the epitaxial discrete regions 15' may be processed into lightly doped discrete regions 15. The conductive type of the lightly doped layer 12 may be identical to the conductive type of the heavily doped layer 11.

The EPI layer 12' may be treated by any appropriate process to form the lightly doped layer 12. In one embodiment, the lightly doped layer 12 may be formed by performing an ion implantation process on the EPI layer 12'.

In certain other embodiments, the lightly doped layer 12 may be formed by the diffusion of the doping ions in the heavily doped layer 11 into the EPI layer 12'. The diffusion of the doping ions may be caused by a high temperature thermal annealing process. In one embodiment, the temperature of the high temperature thermal annealing process may be in a range of approximately 950° C.~1100° C. The time of the high temperature thermal annealing process may be in a range of approximately 10 s~60 mins. Such a high temperature thermal annealing process may activate the doping ions in the heavily doped layer 11 and the doping ions the lightly doped layer 12 simultaneously.

Further, as shown in FIG. 14, after forming the lightly doped layer 12, an electrode region 20 may be formed each row of portions of the lightly doped layer 12 insulated by the deep trenches 13. The electrode region 20 may be used to apply a row selecting voltage on the corresponding row of portions of the lightly doped layer 12 through the corresponding portion of the heavily doped layer 11.

In one embodiment, the electrode regions 20 are heavily doped regions. The lightly doped layer 12 may be N-type lightly doped layer (N); and the electrode regions 20 may be N-type heavily doped regions (N).

The electrode regions 20 may be formed by any appropriate process. In one embodiment, the electrode regions 20 is formed by forming a mask layer on the lightly doped layer 12; and followed by performing an ion implantation process using the mask layer as a mask. The doping ions may be any appropriate ions. In one embodiment, the doping ions are As ions. The implanting dosage may be in a range of approximately $1.0e15$ $cm^{-2}$~$8.0e15$ $cm^{-2}$. The implanting energy may be in a range of approximately 15 KeV~65 KeV.

Returning to FIG. 19, after forming the electrode regions 20, a metal silicide layer may be formed (S105). FIGS. 2~4 illustrate a corresponding structure.

As shown in FIGS. 2~4, a metal silicide layer 17 is formed on the lightly doped layer 12 and the electrode regions 20. The lightly doped discrete region 15 and the portion of the metal silicide layer 17 on the lightly doped discrete region 15 may form a Schottky diode memory cell 18.

The metal silicide layer 17 may be formed by forming a metal layer on the lightly doped layer 12 and the electrode regions 20; and followed by a high-temperature process. The metal layer may be made of any appropriate material, such as Ni, Co, or Ti, etc. Correspondingly, after the high-temperature process, the metal layer may react with silicon to form NiSi, CoSi, or TiSi, etc.

The high-temperature process may include two steps. The temperature of the first step may be in a range of approximately 200° C.~450° C.; and the time of the first step may be in a range of approximately 10 s~60 s. The second step may be a spike annealing process. The temperature of the spike annealing process may be in a range of approximately 400° C.~900° C.

In one embodiment, before forming the metal silicide layer 17, an ion implantation process may be performed on the lightly doped layer 12 to adjust the potential barrier of the subsequently formed Schottky diodes. The lightly doped layer 12 is N-type lightly doped layer ($N^-$). The type of ions of the ion implantation process may P-type, or N-type. In one embodiment, the ions are B ions, or $BF_2$ ions. The dosage of the ion implantation process may be in a range of approximately $1.0e12$ $cm^{-2}$~$1.0e14$ $cm^{-2}$. The implanting energy may be in a range of approximately 5 KeV~20 KeV. In certain other embodiments, the doping ions may be P ions, or As ions.

Returning to FIG. 19, after forming the metal silicide layer 17, conductive vias may be formed (S106). FIGS. 2~4 illustrates a corresponding semiconductor structure.

As shown in FIGS. 2~4, conductive vias 19 are formed on a partial number of the plurality of Schottky diode memory cells 18. That is, the conductive vias 19 may not be formed on all Schottky diode memory cells 18. When the Schottky diode memory cells are selected, column selecting voltage may be applied on the Schottky diode memory cells 18 through the corresponding conductive vias 19.

A process for forming the conductive vias 19 may include forming a dielectric layer (not shown) on the metal silicide layer 17; forming a through-hole in the dielectric layer on each of the pre-selected Schottky diode memory cells 18; and filling the plurality of through-holes with a metal material. Thus, the conductive vias 19 may be formed on the pre-selected Schottky diode memory cells 18.

The dielectric layer may be made of any appropriate material. In one embodiment, the dielectric layer is made of silicon oxide. Various processes may be used to form the dielectric layer, such as a CVD process, or a PVD process, etc.

The through-holes may be formed in the dielectric layer by any appropriate process, such as a dry etching process, or a wet etching process, etc. In one embodiment, a dry etching process is used to form the through-holes.

The metal material may be W, Ti, or Ta, etc. Various processes may be used to form the metal material, such as a CVD process, a PVD process, an FCVD process, or a sputtering process, etc. In one embodiment, the metal material is formed by a sputtering process.

Figure 20:
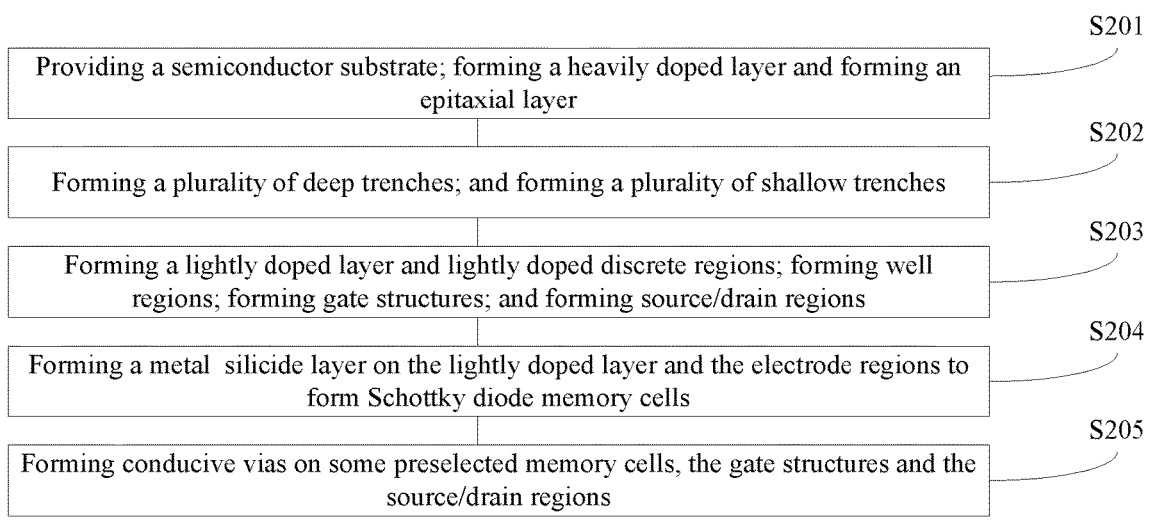
FIG. 20 illustrates an exemplary fabrication process of a mask read-only memory device consistent with the disclosed embodiments.

To performing a data reading process, the Mask ROM array may need a peripheral circuit. The Mask ROM array and the peripheral circuit may form a mask ROM device. FIG. 20 illustrates an exemplary fabrication process of a Mask ROM device. FIGS. 15~18 illustrate semiconductor structures corresponding certain stages of the exemplary fabrication process.

Figure 15:
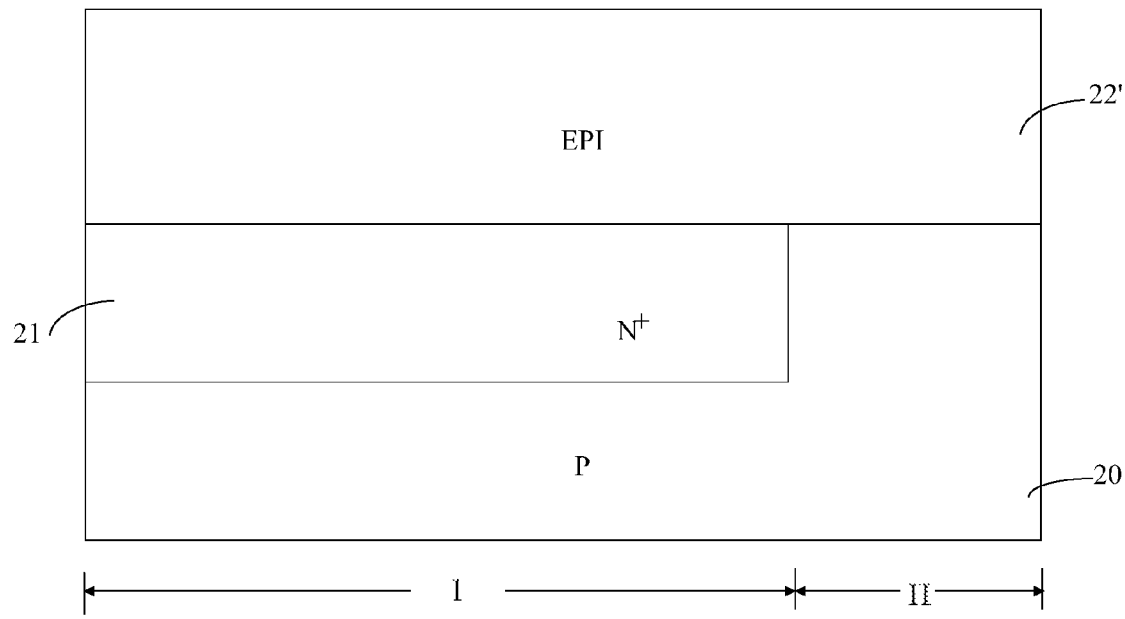
FIGS. 15~18 illustrate structures corresponding to certain stages of an exemplary fabrication process of a mask read-only memory device consistent with the disclosed embodiments.

As shown in FIG. 20, at the beginning of the fabrication process, a semiconductor substrate with certain structure is provided (S201). FIG. 15 illustrates a corresponding semiconductor structure.

As shown in FIG. 15, a semiconductor substrate 20 is provided. The semiconductor substrate 20 may have a core unit region I and a peripheral region II. A heavily doped layer 21 may be formed in a portion of the surface of the semiconductor substrate 20 in the core unit region I with a pre-determined depth. The heavily doped layer 21 may be formed by an ion implantation process, etc. The heavily doped layer 21 may be N-type heavily doped ($N^+$). Further, an epitaxial (EPI) layer 22' may be formed on the surface of the semiconductor substrate 20.

The semiconductor substrate 20 may be made of any appropriate semiconductor materials, such as single crystal silicon, polysilicon, silicon on insulator (SOI), germanium on insulator (GOI), silicon germanium, carborundum, indium antimonite, lead telluride, indium arsenide, indium phosphide, gallium arsenide, gallium antimonite, alloy semiconductor or a combination thereof. In one embodiment, the semiconductor substrate 20 is made of silicon.

The EPI layer 22' may be made of any appropriate material, such as silicon, silicon germanium, or compound semiconductor material, etc. In one embodiment, the EPI layer 22' is made of silicon. Various processes may be used to form the EPI layer 22', such as a CVD process, or an epitaxial growth process, etc.

Figure 16:
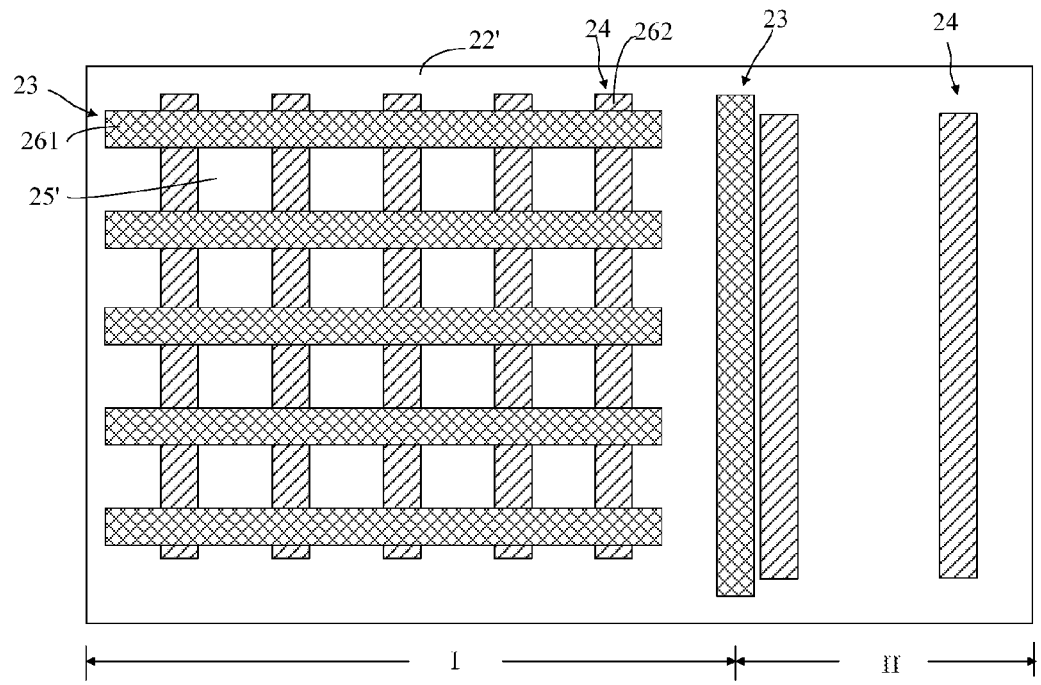

Returning to FIG. 20, after forming the EPI layer 22', a plurality of deep trenches and a plurality of shallow trenches may be formed (S202). FIG. 16 illustrates a corresponding semiconductor structure.

As shown in FIG. 16, a plurality of deep trenches 23 are formed along a row direction in the core unit region I. Further, a deep trench 23 may also be formed in the border region between the core unit region I and the peripheral region II. The deep trenches 23 may penetrate through the EPI layer 22', the heavily doped layer 21 and into a portion of the semiconductor substrate 20 under the heavily doped layer 21. Thus, the portions of the EPI layer 22' and the portions of the heavily doped layer 21 at both sides of the deep trenches 23 may be electrically insulated.

The deep trenches 24 may be formed by forming a patterned mask layer covering the peripheral circuit region II, and exposing portions of the surface of the semiconductor substrate 20 in the core unit region I on the surface of the semiconductor substrate 20; and followed by a dry etching process. The patterned mask layer may be a patterned photoresist mask, or a patterned hard mask.

Further, after forming the plurality of deep trenches 23, a first insulation material 261 may be formed on the EPI layer 22' and in the plurality of deep trenches 23. Then, a planarization process may be performed to remove the portion of the first insulation material 261 higher than the surface of the EPI layer 22'.

Further, as shown in FIG. 16, after forming the first insulation material 261, a plurality of shallow trenches 24 may be formed in EPI layer 22' in the core unit region I and the peripheral region II along a column direction. The shallow trenches 24 in core unit region I may be perpendicular to the deep trenches 23 in the core unit region I. The adjacent shallow trenches 24 in the core unit region I and the adjacent deep trenches 23 in the core unit region I may divide the EPI layer 22' into a plurality of EPI discrete regions 25'. The shallow trenches 24 in the peripheral regions II may be used to form a plurality of active regions.

Further, after forming the plurality of shallow trenches 23, a second insulation material 262 may be formed on the EPI layer 22' and in the plurality of shallow trenches 24. Then, the portion of the second insulation material 262 higher than the surface of the EPI layer 22' may be removed by a planarization process.

The shallow trenches 24 may be formed by forming a patterned mask layer on the EPI layer 22' and the first insulation layer 261; and followed by a dry etching process. The shallow trenches 24 may only penetrate through the EPI layer 22'.

Figure 17:
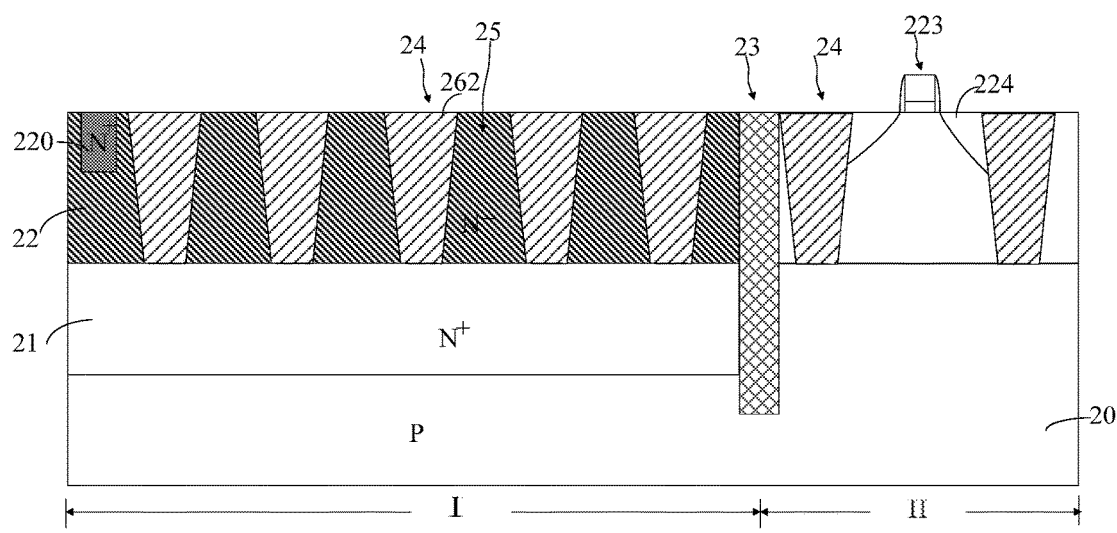

Returning to FIG. 20, after forming the second insulation material 262, a lightly doped layer may be formed (S203). FIG. 17 illustrates a corresponding semiconductor structure.

As shown in FIG. 17, a lightly doped layer 22 is formed. The lightly doped layer 22 may be formed by treating the EPI layer 22' in the core unit region I by a thermal annealing process, or an ion implantation process. The conductive type of the lightly doped layer 22 may be identical to the conductive type of the heavily doped layer 21. Correspondingly, the EPI discrete regions 25' in the core unit region I may be turned into lightly doped discrete regions 25.

Further, the portion of the EPI layer 22' in the peripheral circuit region II may be treated into a well region (not labeled) insulated by the shallow trenches 24. When the EPI layer 22' in the peripheral region II is treated, a mask layer may be formed on the core unit region I to protect the core unit region.

Further, as shown in FIG. 17, after forming the lightly doped layer 22 and the well region, a gate structure 223 may be formed on the surface of the well region; and source/drain regions 224 may be formed in the well region at both sides of the gate structure 223. The gate structure 23 may include a gate oxide layer (not labeled) formed on the surface of the well region, a gate (not labeled) formed on the gate oxide layer; and a sidewall spacer (not labeled) formed on the side surfaces of the gate oxide layer and the gate.

Thus, a MOS transistor may be formed in the peripheral region II. The MOS transistor may be an NMOS transistor, or a PMOS transistor.

Further, as shown in FIG. 17, an electrode region 220 may be formed on each of the rows of portions of the lightly doped layer 22 insulated by the deep trenches 23 in the core unit region I. The electrode region 220 may be used to apply a row selecting voltage to the corresponding row of portions of the lightly doped layer 22 through the corresponding row of the heavily doped layer 21.

In one embodiment, the electrode regions 220 may be formed by a same process for forming the source/drain regions 224 in the peripheral region II. A patterned mask layer may be formed on the core unit region I when the electrode regions 220 and the source/drain regions 224 are formed.

Figure 18:
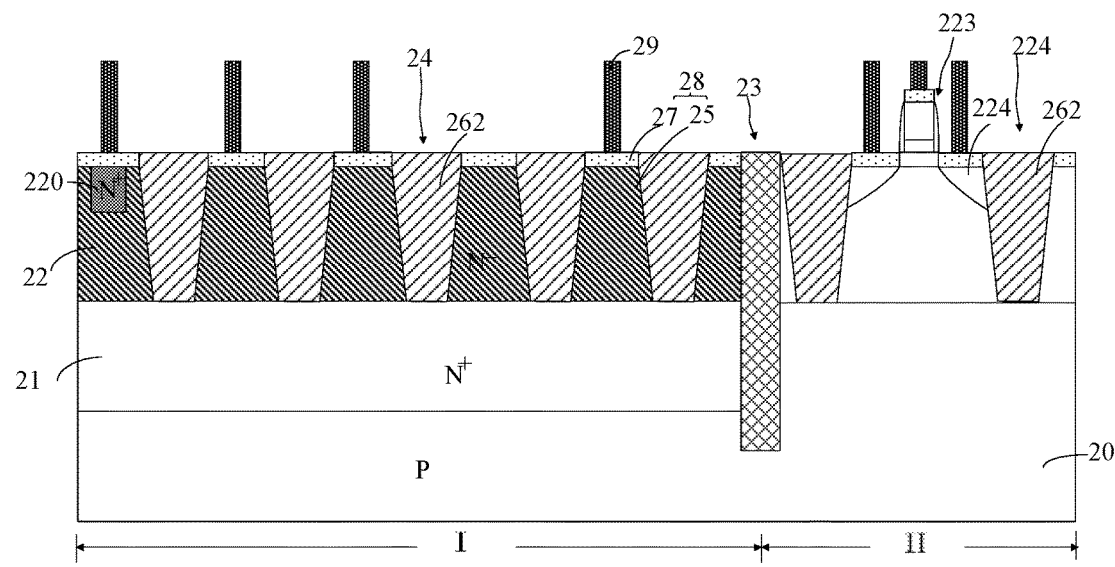

Returning to FIG. 20, after forming the electrode regions 220, a metal silicide layer may be formed (S204). FIG. 18 illustrates a corresponding semiconductor structure.

As shown in FIG. 18, a meal silicide layer 27 is formed on the lightly doped layer 22 in the core unit region I, the electrode regions 220, the gate structure 223 in the peripheral region II and the source/drain regions 224 in the peripheral region II. A lightly doped discrete region 25 and the portion of the metal silicide layer 27 formed on the light doped discrete region 25 may form a Schottky diode memory cell 218.

The metal silicide layer 27 may be formed by forming a metal layer on the lightly doped layer 22 in the core unit region I, the electrode regions 220, the gate structure 223 in the peripheral region II and the source/drain regions 224 in the peripheral region II; and followed by a thermal annealing process. The thermal annealing process may cause the metal to react with silicon to form metal silicide.

Returning to FIG. 20, after forming the metal silicide layer 27, conducive vias may be formed (S205). FIG. 18 illustrates a corresponding semiconductor structure.

As shown in FIG. 18, conductive vias 29 may be formed on some pre-selected Schottky diode memory cells 218 in the core unit region I and the gate structure 223 and the source/drain regions 224 in the peripheral region II. A column selecting voltage may be applied onto a certain memory cell 28 to select the memory cell 18 through the conductive via 29. The conductive via 29 on the gate structure 223 may be used to control the MOS transistor.

The conductive vias 29 may be formed by forming a dielectric layer (not shown) to cover the core unit region I and the peripheral region II; forming through-holes exposing the pre-selected Schottky diode memory cells 28 and the gate structure 223 and the source/drain regions 224; and filling the through-holes with a metal material. Thus, the conductive vias 29 may be formed on the pre-selected Schottky diode memory cells 218 in the core unit region I and the gate structure 223 and the source/drain regions 224 in the peripheral region II.

In one embodiment, to increase the integration level, after forming the conductive vias 29, a metal interconnect structure (not shown) may be formed on the dielectric layer and the conductive vias 29. The metal interconnect structure may connect the electrode regions 20 the word-lines; and connect the conductive vias 19 on the Schottky memory cells 18 with the bit-lines.

The metal interconnect structure may be a single layer structure, or a multiple-layer structure. In one embodiment, the conductive vias 19 and the metal interconnect structure may connect the word-lines and the bit lines with metal interconnect structures in different layers.

In one embodiment, the shallow trenches 24 in the core unit region I and the shallow trenches 24 the peripheral region II may be formed simultaneously. The electrode regions 20 in the core unit region I and the source/drain regions 224 of the MOS transistor in the peripheral region II may be formed simultaneously. The metal silicide layer 27 on the lightly doped discrete regions 25 in the core region I and the metal silicide layer 17 on the gate structure 223 and the source/drain regions 224 in the peripheral region II may be formed simultaneously. The conductive vias 29 on the pre-selected Schottky diode memory units 28 in the core unit region I and the conductive vias 29 on the gate structure 223 and the source and drain regions 224 in the peripheral region II may be formed simultaneously. Thus, the fabrication process of the Mask ROM memory array may be compatible with the fabrication process of the MOS transistor of the peripheral region II.

According to the disclosed structures and processes, Schottky diodes may be used as the memory cells. In a plurality of memory cells, a partial number of the memory cells may be connected with conductive vias; and a partial number of the memory cells may not be connected with conductive vias. For the memory cells connected with conductive vias, bias voltage may be applied on the Schottky diodes through the conductive vias to form a close-loop; and the Schottky diodes may be turned on. For the memory cells not connected with conductive vias, it is unable to apply bias voltage to form a close loop. Thus, the Schottky diodes may not be turned on. Thus, the "1" writing status and the "0" writing status may be discriminated. The on-stage voltage of the Schottky diodes may be relatively small; and may be 0.24V smaller than the on-state voltage of a MOS transistor. Thus, the power consumption of the data reading process may be relatively small. Further, the Schottky diodes may be turned on by the majority carriers. Thus, the running speed of the data reading process may be relatively fast.

Further, the lightly doped discrete regions for forming the Schottky diodes may be limited by adjacent deep trenches and adjacent shallow trenches. A heavily doped region may be formed in the side surfaces of the deep trenches and the shallow trenches in the lightly doped layer. A depletion layer may be formed in the interface between the N-type (or P-type) lightly doped discrete regions and the P-type (or N-type) heavily doped region. Thus, the reverse leakage current of the Schottky diode memory cells formed by the N-type (or P-type) lightly doped discrete regions may be reduced.

Further, the deep trenches may penetrate through the lightly doped layer and the heavily doped layer, and into a portion of the semiconductor substrate. A heavily doped region may be formed in the inner surfaces of the deep trenches. The heavily doped region may form a depletion layer with the lightly doped layer and the heavily doped layer, respectively. Thus, the insulation performance of the deep trenches may be improved.

Further, for the Mask ROM device, the memory cells may be the Schottky diodes. The lightly doped discrete regions of Schottky diodes may be limited by the adjacent deep trenches and the adjacent shallow trenches. The shallow trenches and the active regions in the peripheral region may be formed simultaneously. The metal silicide used as the anodes of the Schottky diodes and the metal silicide of the gate and the source and drain region of the MOS transistors in the peripheral region may be formed simultaneously. Thus, the process for forming the Mask ROM array may be compatible with the process for forming the MOS transistors in the peripheral region.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A mask read-only memory array, comprising:
    a semiconductor substrate having a surface;
    a heavily doped layer formed on the surface of semiconductor substrate;
    a plurality of lightly doped discrete regions formed on the heavily doped layer;
    a metal silicide layer formed on the lightly doped discrete regions, wherein the metal silicide layer and the plurality of lightly doped discrete regions form a plurality of Schottky diode memory cells; and
    conductive vias formed on a partial number of the plurality of Schottky diode memory cells for applying column selecting voltage to select certain memory cells.

2. The mask read-only memory array according to claim 1, further comprising:
    a lightly doped layer formed on the heavily doped layer, from which the plurality of lightly doped discrete regions are formed;
    a plurality of deep trenches penetrating through the lightly doped layer, the heavily doped layer, and a pre-determined depth of the semiconductor substrate to electrically insulate the lightly doped layer and the heavily doped layer into a plurality of portions aligned in a row direction;
    a plurality of shallow trenches penetrating through the lightly doped layer to divide the lightly doped layer into a plurality of portions aligned in a column direction;
    a first insulation material filled in the plurality of deep trenches; and a second insulation material filled in the plurality of shallow trenches,
wherein the plurality of shallow trenches and the plurality of deep trenches divide the lightly doped layer into the plurality of lightly doped discrete regions.

3. The mask read-only memory array according to claim 2, further comprising:
an electrode region formed in each of the rows of portions of the lightly doped layer insulated by the deep trenches, configured for applying row selecting voltage to the row of portions of the lightly doped layer through a corresponding portion of the heavily doped layer.

4. The mask read-only memory array according to claim 2, further comprising:
a heavily doped region formed on the side surfaces and the bottom surfaces of the plurality shallow trenches in the lightly doped layer,
wherein:
the heavily doped region extends from the side surfaces to the lightly doped layer and to the semiconductor substrate; and
a conductive type of the heavily doped region is different from a doping type of the lightly doped layer.

5. The mask read-only memory array according to claim 2, further comprising:
a heavily doped region formed on the side surfaces and the bottom surfaces of the plurality deep trenches,
wherein:
a portion of the heavily doped region in the lightly doped layer extends from the side surfaces to the lightly doped layer;
a portion of the heavily doped region in the heavily doped layer extends from the side surfaces to the heavily doped layer;
a portion of the heavily doped region in the semiconductor substrate extends from the side surfaces and bottom surfaces to the semiconductor substrate; and
a conductive type of the heavily doped region is different from a doping type of the lightly doped layer.

6. The mask read-only memory array according to claim 2, wherein:
the first insulation material include a top portion and a bottom portion;
the top portion is made of un-doped polysilicon; and
the bottom portion is made of silicon oxide.

7. The mask read-only memory array according to claim 2, wherein:
the semiconductor substrate is P-type doped;
the lightly doped layer is N-type lightly doped; and
the heavily doped region is N-type heavily doped.

8. The mask read-only memory array according to claim 1, wherein:
the metal silicide layer is made of one of NiSi, CoSi, PtSi, and TiSi; and
the conductive vias are made of one of W, Ti, and Ta.

9. A method for fabricating a mask read-only memory array, comprising:
providing a semiconductor substrate;
forming a heavily doped layer on the semiconductor substrate;
forming a plurality of lightly doped discrete regions on the heavily doped layer;
forming a metal silicide layer on the plurality of lightly doped discrete regions to form a plurality of Schottky diode memory cells with the plurality of lightly doped discrete regions; and
forming a conductive via on each of a partial number of the plurality of Schottky diode memory cells for applying column selecting voltage to select certain memory cells.

10. The method according to claim 9, wherein forming the plurality of lightly doped discrete regions further comprises:
forming a plurality of deep trenches penetrating through the epitaxial layer, the heavily doped layer, and a pre-determined depth of semiconductor substrate along a row direction;
forming a first insulation material in the plurality of deep trenches;
forming a plurality of shallow trenches penetrating through the epitaxial layer along a column direction, wherein the plurality of shallow trenches and the plurality of deep trenches divide the epitaxial layer into a plurality of epitaxial discrete regions;
forming a second insulation material in the plurality of shallow trenches; and
treating the epitaxial layer into a lightly doped layer, wherein the plurality of epitaxial discrete regions are treated into the plurality of lightly doped discrete regions.

11. The method according to claim 10, after forming the plurality of lightly doped discrete regions, further comprising:
forming an electrode region in each of rows of portions of the lightly doped layer insulated by the plurality of deep trenches.

12. The method according to claim 10, wherein:
the heavily doped layer is N-type doped by an ion implantation process;
doping ions are As ions;
an implanting dose of the As ions are in a range of approximately $1.0e15\ cm^{-2} \sim 8.0e15\ cm^{-2}$; and
an implanting energy is in a range of approximately 30 KeV~80 KeV.

13. The method according to claim 10, wherein:
the shallow trenches are perpendicular to the deep trenches.

14. The method according to claim 10, before forming the first insulation material, further including:
forming a pad oxide layer on inner side surfaces of the deep trenches; and
forming a heavily doped region in the inner side surfaces of the deep trenches by a vertical ion implantation process and an inclining ion implantation process.

15. The method according to claim 10, before forming the second insulation material, further including:
forming a pad oxide layer on inner side surfaces of the shallow trenches; and
forming a heavily doped region in the inner side surfaces of the shallow trenches by a vertical ion implantation process and an inclining ion implantation process.

16. The method according to claim 14, wherein:
the heavily doped region is P-type doped;
doping ions of the heavily doped region are one of B ions and $BF_2$ ions;
a doping dosage of B ions is in a range of approximately $1.0e13\ cm^{-2} \sim 8.02e14\ cm^{-2}$;
an implanting energy of B ions is in a range of approximately 5 KeV~15 KeV;
an inclining angle of the B ions is in a range of approximately 0~45°;
a doping dosage of $BF_2$ ions is in a range of approximately $1.0e13\ cm^{-2} \sim 8.02e14\ cm^{-2}$;

an implanting energy of $BF_2$ ions is in a range of approximately 5 KeV~15 KeV; and an inclining angle of the $BF_2$ ions is in a range of approximately 0~45°.

17. The method according to claim 14, wherein forming the metal silicide layer further comprises:

performing a first high temperature process; and performing a spike annealing process, wherein:

a temperature of the first high temperature process is in a range of approximately 200° C.~450° C.;

a time duration of the first high temperature process is in a range of approximately 10 s~60 s; and a temperature of the spike annealing process is in a range of approximately 400° C.~900° C.

18. The method according to claim 9, wherein:

the epitaxial layer is formed by a chemical vapor deposition process;

a temperature of the chemical vapor deposition process is in a range of approximately 950° C.~1100° C.;

a process gas of the chemical vapor deposition process is dichlorosilane; and a thickness of the epitaxial layer is in a range of approximately 1000 Å~6000 Å.

19. A method for fabricating a mask read-only memory device, comprising:

providing a semiconductor substrate having a core device region and a peripheral region;

forming a heavily doped layer on the semiconductor substrate;

forming a plurality of lightly doped discrete regions in the semiconductor substrate in the core device region and a plurality of well regions in the semiconductor substrate in the peripheral region;

forming a gate structure on each of the well regions in the peripheral region and source and drain regions in the semiconductor substrate at both sides of the gate structure;

forming a metal silicide layer on the plurality of lightly doped discrete regions, the source and drain regions and the gate structure, wherein the metal silicide layer and the plurality of lightly doped discrete regions form a plurality of Schottky diode memory cells; and forming conductive vias on a partial number of the plurality of memory cells, the gate structures and the source and drain regions, wherein the conductive vias on the partial number of the plurality of Schottky memory cells are used to apply column selecting voltage on the memory cells to select certain memory cells.

20. The method according to claim 19, further comprising:

forming a metal interconnect structure connecting the conductive vias on the Schottky diode memory cells with bit-lines and connecting electrode regions with word-lines over the conductive vias.

* * * * *